United States Patent [19]
Yamazaki et al.

[11] Patent Number: 5,622,607
[45] Date of Patent: Apr. 22, 1997

[54] METHOD OF FORMING AN OXIDE INSULATING FILM

[75] Inventors: Shunpei Yamazaki, Tokyo; Takashi Inushima, Kanagawa, both of Japan

[73] Assignee: Semiconductor Energy Laboratory Co., Ltd., Kanagawa-ken, Japan

[21] Appl. No.: 793,003

[22] Filed: Nov. 15, 1991

[30] Foreign Application Priority Data

Nov. 27, 1990 [JP] Japan .................................. 2-324904

[51] Int. Cl.⁶ .................................................. C23C 14/34
[52] U.S. Cl. ............................... 204/192.15; 204/192.22; 204/192.23; 438/151; 438/788; 438/910
[58] Field of Search .................... 204/192.12, 192.15, 204/192.22, 192.23; 437/235, 238

[56] References Cited

U.S. PATENT DOCUMENTS

| | | | |
|---|---|---|---|
| 3,607,697 | 9/1971 | Shim et al. | 204/192.23 |
| 3,624,895 | 12/1971 | MacIver et al. | 204/192.22 X |
| 3,763,026 | 10/1973 | Cordes | 204/192.23 X |
| 4,014,772 | 3/1977 | Noods et al. | 204/192.22 |
| 4,515,668 | 5/1985 | Brownell et al. | 204/192.22 |
| 4,532,022 | 7/1985 | Takasaki et al. | 204/192.23 X |
| 4,540,466 | 9/1985 | Nishizawa | 204/192.25 X |
| 4,597,159 | 7/1986 | Usami et al. | 204/192.23 |
| 4,804,640 | 2/1989 | Kaganowicz et al. | 204/192.23 X |
| 4,849,081 | 7/1989 | Ross | 204/192.23 X |

FOREIGN PATENT DOCUMENTS 0190051  8/1986  European Pat. Off. .......... 204/192.23

OTHER PUBLICATIONS

The Random House College Dictionary, Revised Ed., p. 716.

*Primary Examiner*—Nam Nguyen
*Attorney, Agent, or Firm*—Sixbey, Friedman, Leedom & Ferguson, PC; Gerald J. Ferguson, Jr.; Jeffrey L. Costellia

[57] ABSTRACT

A process for fabricating films improved in interface characteristics, which comprises depositing an oxide insulating film by sputtering under an irradiation of a light in an atmosphere comprising an oxidative gas at an amount larger than that of an inactive gas is disclosed. Particularly, a light having a wavelength of 300 nm or shorter is used for the irradiation.

17 Claims, 8 Drawing Sheets

METHOD OF FORMING AN OXIDE INSULATING FILM

BACKGROUND OF THE INVENTION

1. Field of the Invention

The present invention relates to a method of forming oxide insulating films having excellent interface properties, which comprises depositing films by sputtering under irradiation of a light beam, more particularly to a method of forming oxide insulating films suitable as gate insulator films of insulated gate field-effect transistors (FETs) which are used in semiconductor integrated circuits and as driver devices of large-area liquid crystal displays, as well as insulator films of thin film semiconductor devices (e.g., photoelectric conversion devices) which are mounted on substrates. The present invention relates also to a method of forming an insulated gate field effect transistor comprising such an oxide insulating film and to a method of forming a capacitor comprising such an oxide insulating film.

2. Description of the Prior Art

Much attention is now paid to active devices or semiconductor integrated circuits (ICs) or capacitors which take advantage of oxide insulating films or oxide dielectric films fabricated by methods such as chemical vapor deposition (CVD). The insulating films (since the dielectric films of capacitors also are insulating films, the dielectric films of capacitors are referred to simply as insulator films or insulating films hereinafter, together with the insulating films of the ICs and the active devices) have been conventionally fabricated by a method such as CVD, which advantageously allows the films to be deposited at a temperature as low as 450° C. or even lower, thus economizing on substrates by using those made of, for example, soda-lime glass or borosilicate glass.

As alternative methods for fabricating oxide insulating films at a low temperature comparable to that of CVD, there are also known depositing silicon oxide films by plasma-assisted CVD or by sputtering using a sputtering gas in which Ar atoms account for 80 to 100%.

Furthermore, there is also proposed fabricating silicon oxide films by photochemical vapor deposition, to use the films as gate oxide films of insulated gate field-effect transistors (FETs). This process is advantageous in that the film thus deposited achieves a density of interface states (interface level density) of about $2\times10^{10}$ $eV^{-1}$ $cm^{-2}$ without suffering any damage which may be caused by the reaction with the underlying semiconductor or electrode material. However, it takes too long a time for the film deposition (i.e., too low in the film deposition rate) to be an industrially feasible process. The use of hydrogen also induces a hot-electron effect, which causes problems concerning the long reliability of the film.

In short, the insulating films thus fabricated by any of the conventional methods suffer a problem of having an unwanted density of interface states developed at the interfaces with the semiconductor layers, due to the presence of hydrogen or impurity, such as sodium, which functions as a fixed charge, or by the presence of a dangling bond.

SUMMARY OF THE INVENTION

An object of the present invention is to provide a method of forming a highly reliable oxide insulating film free from dangling bonds and having a low density of interface states.

It is another object of the present invention to provide a method of forming an insulated gate field effect transistor comprising such an oxide insulating film.

It is a further object of the present invention to provide a method of forming a capacitor comprising such an oxide insulating film as a dielectric film thereof provided between a pair of electrodes thereof.

The foregoing and other objects of the present invention have been attained by the use of a process which is characterized by carrying out sputtering in an atmosphere comprising oxidative gas (oxydizing gas) preferably at an amount larger than that of an inert gas, more preferably in 100% oxidative gas, under irradiation of a light beam preferably comprising a light of 300 nm or less in wavelength. The oxidative gas can be directly excited by the light of 300 nm or shorter in wavelength.

More specifically, the present invention enables fabrication of a dense oxide insulating film having a low density of interface states by a process which comprises depositing an oxide insulating film by sputtering in an atmosphere containing an oxidative gas at an amount larger than that of an inert gas, while irradiating a light to either or both of the sputtered grains and the surface to be coated with the oxide insulating film.

The process may comprise first irradiating a light to the surface to be coated with the oxide insulating film, and then depositing an oxide insulating film by sputtering under the irradiation of a light.

An ultraviolet (UV) lamp capable of emitting a light at a wavelength of 300 nm or shorter, particularly at a wavelength of 254 nm and 185 nm, is suitable for use in the process according to the present invention.

The process is also characterized by that it comprises depositing films in an atmosphere containing an oxidative gas at an amount larger than that of an inactive gas (e.g., Ar). This has been established based on experimental results; it has been found that the Ar gas commonly used in depositing an insulator film, e.g., an $SiO_2$ film, from a target by sputtering is incorporated into the deposited film at a considerable amount, and that this has been the cause of the fixed charge.

BRIEF DESCRIPTION OF THE DRAWINGS

FIG. 8 is a graph showing the relation between $\Delta V_{FB}$ and optical intensity of the light irradiated during the film deposition, which illustrates the effect of the process according to the present invention as exemplified by Example 1;

DETAILED DESCRIPTION OF THE PREFERRED EMBODIMENTS

Figure 1:
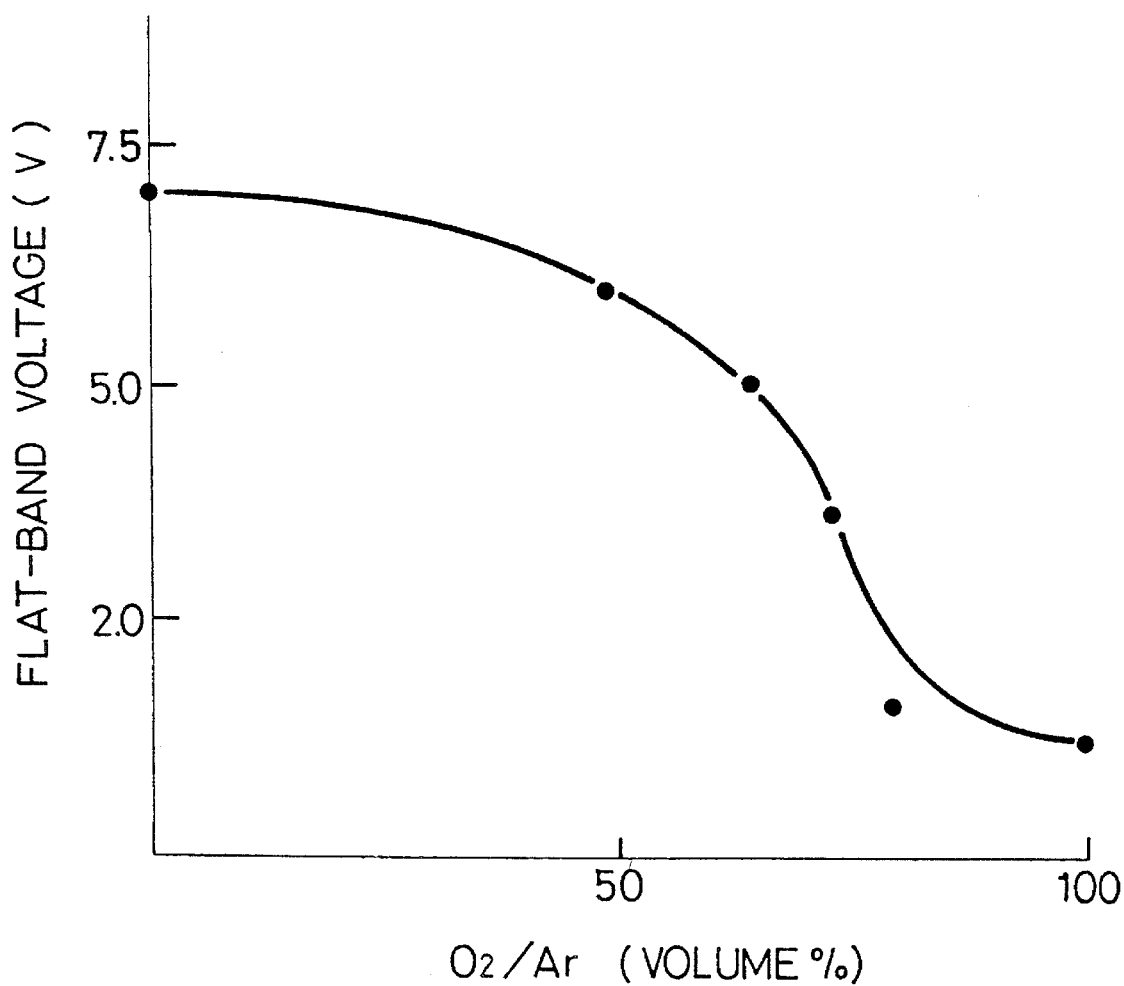
FIG. 1 is a graph showing the relation between the volumetric ratio of oxygen to an inactive gas ($O_2$/Ar) of the atmosphere in which a silicon oxide film was deposited, and the flat-band voltage of the silicon oxide film thus obtained.

In FIG. 1 is shown the relation between the flat-band voltage of a silicon oxide ($SiO_2$) film deposited by sputtering in an atmosphere comprising oxygen ($O_2$) and argon (Ar), and the volumetric ratio of oxygen to an inactive gas ($O_2/Ar$). The silicon dioxide film is deposited at a thickness of 500 Å on a silicon substrate, under a mixed gas atmosphere of oxygen and argon at various $O_2/Ar$ ratios in the range of from 0.1 to 100 (vol %).

The flat-band voltage is a voltage necessary to cancel out the influence of the fixed charge within the insulating film; hence, the lower the voltage, the higher are the electrical stability and the reliability of the film.

Referring to FIG. 1, it can be seen clearly that the flat-band voltage is lower for the films deposited under an atmosphere containing lower amount of an inactive gas (e.g. Ar), i.e., under an atmosphere containing higher amount of the oxidative gas, oxygen. Thus, it can be understood that a silicon oxide film of lower flat-band voltage, i.e., of higher electrical stability and reliability, results when a film deposition by sputtering is carried out under an atmosphere containing 100 vol. % oxygen.

As the oxidative gas for use in the sputtering, ozone ($O_3$), nitrous oxide ($N_2O$), and the like may be used as alternatives to oxygen ($O_2$).

Among the foregoing oxidative gases, the use of ozone enables deposition of a pin-hole free insulator film on the substrate, with less dielectric loss and less fluctuation in dielectric breakdown voltage (dielectric strength). This is ascribed to the presence of an active oxygen atom formed from ozone upon receipt of some kind of energy, e.g., an optical energy, which enables deposition of a dense oxide insulating film. However, the use of ozone is not suitable for a practical process, because ozone undergoes decomposition into oxygen and hence it cannot be stored in a large amount in a bomb.

However, ozone can be produced in a sputtering atmosphere from oxygen in the sputtering atmosphere by rendering oxygen in the sputtering atmosphere absorb a light around 185 nm in wavelength. For example, the production is carried out by irradiating a light of 300 nm or shorter in wavelength to the sputtered atoms during their flight in the sputtering atmosphere or to the surface to be coated therewith in case of deposition of silicon dioxide ($SiO_2$) film as the oxide insulating film. The ozone thus produced is then activated to yield oxygenlike atoms upon absorption of light around 254 nm in wavelength. The light is also irradiated to the silicon atom clusters or free silicon atoms formed by sputtering. The sputtered silicon is directly excited by a light not longer than 200 nm in wavelength and reacts with oxygen atoms and molecules during its flight in the sputtering atmosphere, thus contributing to the formation of a dense silicon oxide film.

Oxide insulating films according to the present invention include, in addition to the silicon oxide film, those of tantalum oxide and titanium oxide as representative examples. Furthermore, oxide ferroelectric films, e.g. barium titanate and lead titanate films, are included as oxide insulating films according to the present invention.

EXAMPLE 1

A process according to the present invention was applied to the fabrication of metal oxide films such as dielectric films (e.g., films of tantalum oxide and titanium oxide) and ferroelectric films (e.g., barium titanate film), which are used for capacitors in IC chips of dynamic random access memories (DRAMs) comprising an insulated gate semiconductor device and a capacitor.

Figure 2:
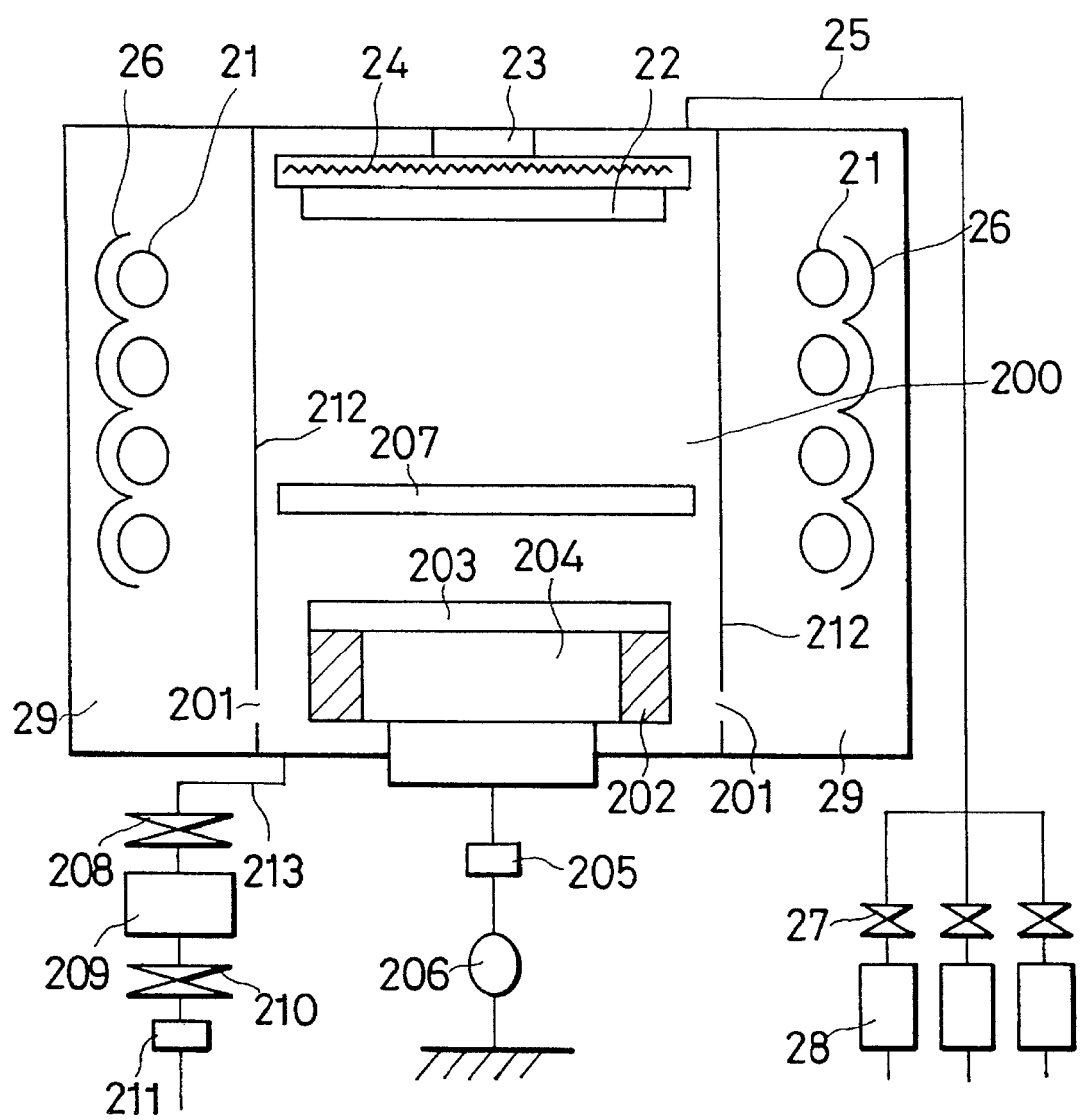
FIG. 2 is a schematic view of an RF (radio-frequency) magnetron sputtering apparatus used in Example 1 of the present invention, equipped with a UV lamp.

The films were sputtered using an RF magnetron sputtering apparatus as shown schematically in FIG. 2, under 100% oxygen atmosphere. For the purpose of gettering (capturing) the impurities which may develop into fixed charges in the film, it is effective to obtain a doped film containing therein phosphorus or boron at a concentration of from $1\times10^{19}$ to $5\times10^{20}$ atoms.$cm^{-3}$, preferably, from $1\times10^{20}$ to $3\times10^{20}$ atoms.$cm^{-3}$ as the oxide insulating film of the present invention, by adding from 0.001 to 30% by volume, preferably, from 0.1 to 5% by volume of $PH_3$ or $B_2H_6$ to the atmosphere.

Referring to FIG. 2, the RF magnetron sputtering apparatus is described below. A light 300 nm or shorter in wavelength is irradiated from a UV light (ultraviolet light) source 21, and the direction of the UV light emitted therefrom is controlled by a semicircular reflector 26. The reflector 26 is allowed to make a circumferential movement around the center axis of the UV lamp, so that the UV light may be irradiated along a direction parallel to the figure plane. A substrate 22, a holder 23 which rotates when necessary, a heater 24 for heating the substrate, and a gas introducing system 25 are also shown. The gas is supplied from a gas supplying system 28 such as bombs charged with oxygen, via a valve 27 of the gas introducing system. Though a supply system for only one type of gas is shown in FIG. 2, there may be provided additional gas supply systems, if necessary, for gases such as argon, phosphine, diborane, and nitrogen. In such a case, the apparatus may be equipped with a plurality of gas-introducing systems to thereby enable a simultaneous supply of a plurality of gases into the reaction chamber. The light source chamber 29 is connected to the reaction chamber 200 via a slit 201. This enables equilibration of the pressure inside the reaction chamber 200 with that inside the light source chamber 29. A quartz plate 212 is provided between the reaction chamber and the light source chamber to let the radiation from the light source 21 to be irradiated to the reaction chamber.

A radio-frequency power source (13.56 MHz) 206 is established with a high-frequency matching apparatus 205, which is connected to a magnetron 204 comprising magnets 202 provided in a circular arrangement.

The reaction chamber 200 comprises therein a shutter 207 to avoid sputtered particles (i.e., sputtered atoms, clusters, ions, etc.) from being deposited on the substrate. The shutter is provided mainly for the purpose of preventing the deposition of sputtered impurities on the substrate upon initiation of sputtering, however, it may be used properly during deposition as well to interfere sputtered particles from reaching the surface on which the film is deposited.

To obtain thin films doped with impurities under an atmosphere completely devoid of hydrogen, the target 203 may optionally contain an intentionally added impurity element such as phosphorus, boron, and fluorine.

The chambers 200 and 29 are evacuated by the gas evacuation system 213 comprising a turbo-molecular pump 209 and an oil-sealed rotary vacuum pump 211. Valves 208 and 210 are each provided to this evacuation system.

The substrate 22 was heated with a heater 24 in this Example, but there may be used an infrared heating lamp as an alternative heating means.

A UV lamp well known in the art and used in photochemical vapor deposition apparatuses was used as a light source in this Example, however, any light source capable of irradiating a light 300 nm or shorter in wavelength is suitable; thus the use of a line beam or a planar beam emitted from an excimer laser is further effective for the process.

The use of a sputtering apparatus as shown in FIG. 2 enables deposition of a highly reliable oxide insulator film having excellent interface properties, because the optical energy applied to the sputtered material during its flight in the sputtering atmosphere or upon settling on the surface to be coated not only promotes a more complete oxidation reaction between the sputtered material and the sputtering gas (i.e., oxygen), but also activates the surface of the substrate (e.g., a semiconductor layer) by the light irradiated thereon. The deposition of a favorable film may be further enhanced by incorporating simultaneously a gas containing a halogen element at an amount of from 0.2 to 20% by volume to the oxidative gas, since it enables neutralization of alkali ions or dangling bonds accidentally taken up into the silicon oxide during the sputtering. There is no particular restriction with respect to the sputtering method, and there may be employed an RF sputtering, a DC sputtering, etc. However, when metal oxides having low electric conductivity, e.g., $Ta_2O_5$, are used as the sputtering target, it is preferred to use a magnetron RF (high frequency) sputtering method at a frequency as high as 13.56 MHz from the viewpoint of conducting continuously the process under a stable discharge.

The halogen elements are added to the oxidative gas in the form of fluoride gases, and usable are nitrogen fluorides (i.e., $NF_3$ and $N_2F_4$), hydrogen fluoride (HF), fluorine ($F_2$) and Freon gases. Alternatively, chloride gases are used, and included are carbon tetrachloride ($CCl_4$), chlorine ($Cl_2$), and hydrogen chloride (HCl).

An example according to the process of the present invention is described in further detail below.

A tantalum oxide film was deposited on a silicon semiconductor in an oxygen atmosphere using the RF magnetron sputtering apparatus shown in FIG. 2, and a 1-mm diameter aluminum electrode was deposited thereon by electron beam (EB) vapor deposition to evaluate electric properties of the film.

More specifically, the substrate was shielded with a shutter 207 from the sputtered particles at the initial stage of the process while applying an optical energy on the silicon substrate by concentrating the light beam thereon using a reflector 26. Then, the shutter 207 was opened while continuing light irradiation, to thereby allow the sputtered particles to deposit on the silicon substrate (22 in this case). Thus was obtained a tantalum oxide film on the silicon substrate.

Figure 3:
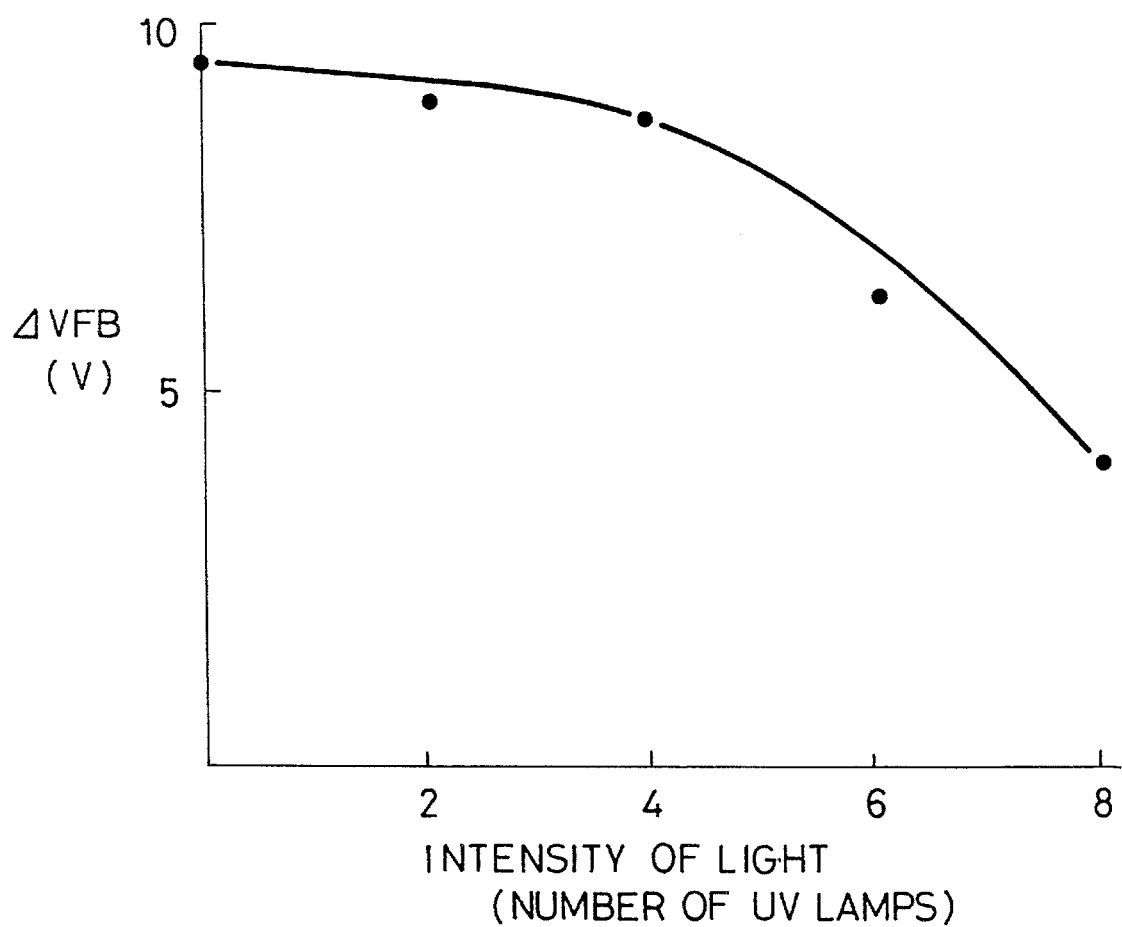

Referring to FIG. 3, the difference in flat-band voltages (VFB) is related to the light intensity of the UV lamp.

The difference in flat-band voltages here is the difference of the flat-band voltage obtained after subjecting the film to a BT (bias-temperature) treatment which comprises applying a negative bias voltage of $2\times10^6$ V/cm at 150° C. for 30 minutes to the gate electrode side, and that obtained after applying a positive bias voltage thereto under the same condition as above. The intensity of light here corresponds to the number of UV lamps used in the sputtering apparatus shown in FIG. 2. Thus, the intensity increase is, in fact, non-linear in this case.

The flat-band voltage is a voltage necessary to cancel out the influence of the fixed charge within the insulating film; hence, the lower the voltage, the higher are the electrical stability and the reliability of the film. Thus, fluctuation of the flat-band voltage VFB upon application of a voltage suggests the electrical instability of the film.

Referring to FIG. 3, the ΔVFB can be seen to decrease with increasing intensity of light.

In conventional sputtering processes under 100% Ar atmosphere, no effect was observed by the irradiation of light. This, as mentioned earlier, might be due to the absence of oxygen which is activated by the irradiation of a light 300 nm or shorter in wavelength.

In conclusion, an insulating film having a high electric stability can be deposited by the process according to the present invention, which comprises sputtering in oxygen atmosphere under irradiation of a light 300 nm or shorter in wavelength.

EXAMPLE 2

The film construction according to the present invention was applied to a capacitor provided on a silicon substrate, for use in an insulated-gate semiconductor chip.

Figure 4A:
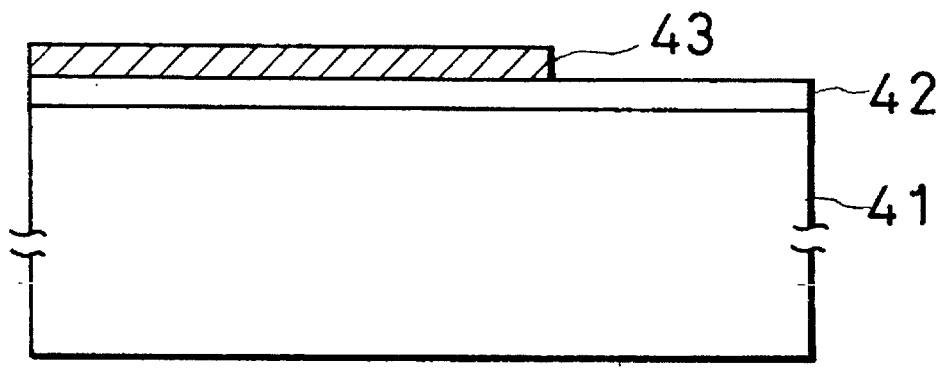
FIGS. 4(A) and 4(B) are cross sectional views of the film construction, illustrating the film fabrication process according to Example 2 of the present invention.

Referring to FIG. 4, the fabrication process is described below. On a silicon substrate 41 was first deposited a lower electrode 42. Further thereon was deposited a tantalum oxide insulating film 43 in the same manner as in EXAMPLE 1 to obtain a film construction as shown in FIG. 4(A). The deposition of the tantalum oxide film was carried out while irradiating a light to a substrate 42 (the lower electrode 42 in this EXAMPLE 2), under conditions as follows:

| | |
|---|---|
| Target: | 99.99% $Ta_2O_5$ |
| Reactive gas: | 100 vol. % $O_2$ |
| Reaction pressure: | 0.05 Torr |
| RF (13.56 MHz) output power: | 500 W |
| Substrate temperature: | 100° C. |
| Distance between the target and the substrate: | 150 mm |
| Light irradiation power: | 1 kW (UV lamp). |

Figure 4B:
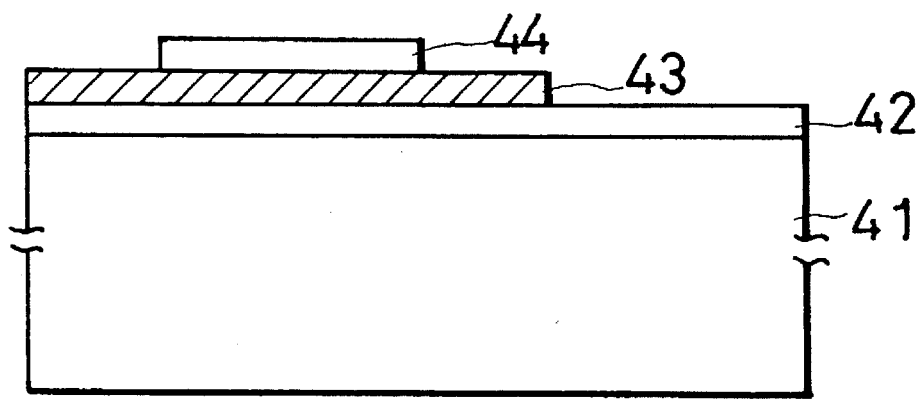

An upper electrode 44 made of aluminum was then formed on the film structure by EB vapor deposition to thereby obtain a capacitor as shown in FIG. 4(B).

The materials to be used in the sputtering preferably are each as high as possible in purity. For example, most preferred for the sputtering targets are those of tantalum oxide, titanium oxide, barium titanate, and lead titanate having a purity of 4N (99.99%) or higher. Similarly, the gases used in the sputtering were of high purity (5N or higher), so as to avoid inclusion of impurities in the insulating film.

EXAMPLE 3

Figure 5:
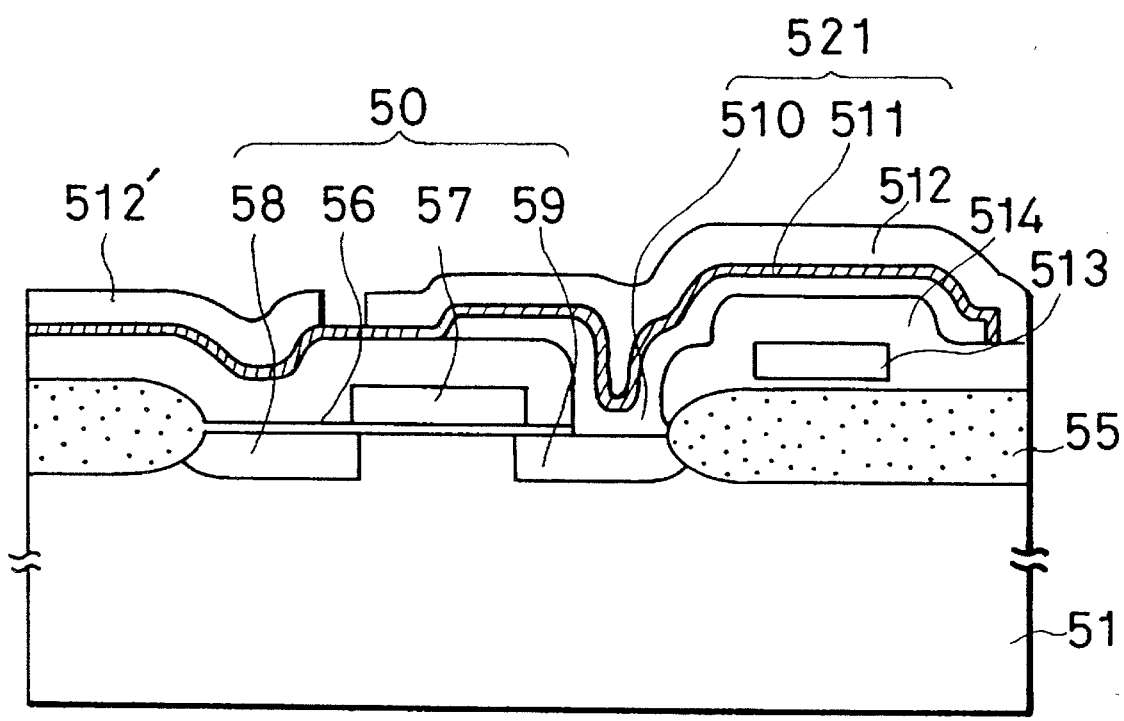
FIG. 5 is a cross sectional view of the film construction obtained in Example 3 according to the present invention.

Referring to FIG. 5, a method of forming an insulated gate field effect transistor device comprising the oxide insulating film in accordance with the present invention will be described below.

More specifically, in this Example, the process according to the present invention is applied to the fabrication of a 1-Tr/cell DRAM cell.

On a semiconductor substrate 51 is constructed an insulated-gate field-effect transistor (FET) 50 comprising a source or drain 58, a drain or source 59, a gate electrode 57, and a gate insulating film 56. A capacitor 521 comprising a tantalum oxide dielectric 511, a lower electrode 510 and an upper electrode 512 is connected to the drain or source 59 of this transistor in series as shown in FIG. 5. There is also provided a buried insulator film 55 which surrounds the capacitor and the transistor. Thus is obtained a memory cell construction of a stacked DRAM. In this case, the capacitor dielectric 511 was deposited in 100 vol. % oxygen gas using the RF magnetron sputtering apparatus shown in FIG. 2. The same film deposition conditions as those in Example 1 were employed in the present process.

The tantalum oxide film 511 thus obtained had a high specific dielectric constant of 27 and an improved frequency characteristics even in the high frequency region. Thus, a high capacitance can be obtained as compared with that of a silicon oxide film having a specific dielectric constant of 3.8.

The gate insulating film 56 made of silicon oxide was deposited by sputtering from a silicon oxide target or a fused silicon target in 100 vol. % oxygen. The use of a tantalum oxide film as the gate insulating film by replacing the silicon oxide film above also was found to be favorable, yielding interface states of $2 \times 10^{10}$ cm$^{-2}$ at the interface with the silicon semiconductor.

The lower electrode 510 of the capacitor 521 was provided, in this case, with a silicon semiconductor having phosphorus doped therein. However, there may be used metallic tantalum, tungsten, titanium, and molybdenum, as well as silicides thereof as the electrode material. Furthermore, the tantalum oxide film 511 may be deposited in 100% oxygen atmosphere on the lower electrode 510 by sputtering from a target having added therein phosphorus at a concentration of from $1 \times 10^{19}$ to $5 \times 10^{20}$ atoms.cm$^{-3}$.

An upper electrode 512 was then provided on the tantalum oxide film 511 in a single layer structure of an aluminum film or a multilayered structure comprising a metallic tantalum layer and an aluminum layer provided thereon, to obtain a capacitor 521. The tantalum oxide film was provided at a thickness of from 300 to 3,000 Å, representatively from 500 to 1,500 Å, for example, at a thickness of 1,000 Å. If a silicon oxide or the like having a low dielectric constant were to be used in the place of tantalum oxide, the thickness thereof must be reduced to about 30 Å to use as a memory cell. However, since the tantalum oxide film deposited according to the present invention has a high dielectric constant, it was possible to achieve a thickness as large as, for example, 1,000 Å. This resulted in a film having excellent insulating properties with the number of pin-holes considerably reduced.

Thus, referring to FIG. 5, the channel length of the insulated-gate FET could be reduced to a range of from 0.1 to 1 μm, for instance, to 0.5 μm, so it was possible to fabricate a 1-Tr/Cell memory (1 bit) in an area of 20 μm▢.

It was also possible to avoid inclusion of hydrogen during film deposition of the tantalum oxide film. In the conventional processes, the inclusion of hydrogen often resulted in the formation of trap centers of hot carriers due to the drifting (diffusion) of the hydrogen atoms to the gate insulating films at the heat treatment subsequent to the film deposition. However, the present process comprises depositing the tantalum oxide film by a sputtering processes in an atmosphere free from hydrogen and further comprises forming the upper and lower electrodes also by sputtering in an atmosphere devoid of hydrogen.

Boron may as well be used as the additive instead of phosphorus.

The process according to the present invention provides easily a thin-film transistor (TFT) having excellent properties, by using solely low-temperature processes.

The process according to the present invention further provides highly reliable transistors and capacitors which stably maintain the characteristics for a long period of time, since the hot carriers were eliminated from the gate insulating films.

The capacitors and insulated-gate transistors according to the present invention may be fabricated in a structure different from the staggered type. For instance, a reversed staggered type or a vertical channel type transistors may be employed. Furthermore, an insulated-gate FET for use as a component of a monolithic IC in which a single crystal silicon is employed in the place of amorphous silicon may be fabricated.

The capacitor need not be composed of a single layer ferroelectric, but may have a laminated multilayered structure. Furthermore, the electrodes may be arranged in such a way that they may be sandwiched from the horizontal sides instead of being sandwiched from the upper and lower sides. The modifications mentioned hereinbefore apply to all of the Examples described herein.

EXAMPLE 4

The present Example provides an insulated-gate semiconductor device comprising an insulator substrate having provided thereon a phosphorus-containing silicon oxide film and further thereon an insulated-gate FET, characterized by that a halogen and phosphorus are both added to at least one of said silicon oxide film and a gate insulating film of said insulated-gate FET. The process for fabricating said insulated-gate semiconductor device comprises: depositing a semiconductor film on the surface of the substrate by sputtering in hydrogen or in an inactive gas atmosphere containing hydrogen, and then depositing a silicon oxide film prior to or after deposition of the semiconductor film above, by sputtering in an atmosphere comprising a fluoride gas, an oxide gas, and PH$_3$, or in an atmosphere comprising an inactive gas having added therein a fluoride gas, an oxide gas, and PH$_3$. Thus, there is provided an insulated-gate semiconductor device having formed a channel-forming region of said device from a portion of the semiconductor film and a gate insulating film from a part of the silicon oxide film.

An example for fabricating the channel-forming region from a portion of the semiconductor film to obtain the insulated-gate semiconductor device according to the invention comprises depositing a non-crystalline (amorphous, or virtually the same as being amorphous) semiconductor film (referred to simply as "a-Si film", hereinafter) by sputtering in hydrogen or in an inactive gas atmosphere having added therein hydrogen, and heating the deposited film to a temperature range of from 450° C. to 700° C., representatively at 600° C., so that at least the channel-forming region may crystallize.

The semiconductor film having subjected to the crystallization treatment comprises crystal grains having an average diameter of from 5 to 400 Å and contains 5 atom % or less of hydrogen. Furthermore, since lattice distortion is induced in the crystalline semiconductor film, the crystal grains are tightly brought into contact with each other at the grain boundaries that thereby the barriers which hinder the transfer of the carriers are eliminated. In a polycrystalline structure composed of grains having no lattice distortion, the mobility of the carriers is impaired by a barrier having developed at the grain boundaries due to the segregation of impurity atoms such as oxygen. However, in the semiconductor film according to the present invention in which lattice distortion is induced in the grains, the barriers cannot be developed, or, if any, are in a negligible amount. Hence, a considerably high electron mobility of from 5 to 300 $cm^2/V.sec$ was achieved in the crystallized semiconductor film according to the present invention.

A semiconductor film deposited by a plasma-assisted CVD comprises a considerable amount of amorphous component therein. Thus, the as-deposited film undergoes spontaneous oxidation of the amorphous components and suffers formation of oxide films deep inside the deposited film. In contrast, a film obtained by sputtering is so dense that spontaneous oxidation only occurs at the very vicinity of the surface of the film and does not proceed to the inside of the film. Furthermore, since the film deposited by sputtering is so dense, the crystal grains having lattice distortion are tightly pressed against each other and thereby avoid formation of an energy barrier which interferes the mobility of the carriers at the grain boundaries.

Referring to FIGS. 6(A) to 6(D), the fabrication process of the TFT according to the present invention is described below.

On a glass substrate 61 was deposited a phosphorus-containing $SiO_2$ film 62 at a thickness of from 100 nm to 2 μm, 200 nm in the present Example, using the RF magnetron sputtering apparatus as shown in FIG. 2, from a fused silicon target. The deposition of the film was carried out under conditions as follows:

| | |
|---|---|
| Reaction gas: | 92 vol. % $O_2$ |
| | 5 vol. % $NF_3$ |
| | 3 vol. % $PH_3$ |
| Film deposition temperature: | 150° C. |
| RF (13.56 MHz) output power: | 400 W |
| Total pressure: | 0.5 Pa. |
| Light irradiation power: | 1 kW (UV lamp) |

The concentration of $PH_3$ and $NF_3$ may be controlled as desired within a range of from 0.01 to 10% and from 0 to 20%, respectively. By irradiating a UV light, phosphorus and halogen atoms may be activated to enhance the gettering of hydrogen ions, sodium ions, and like.

Figure 6A:
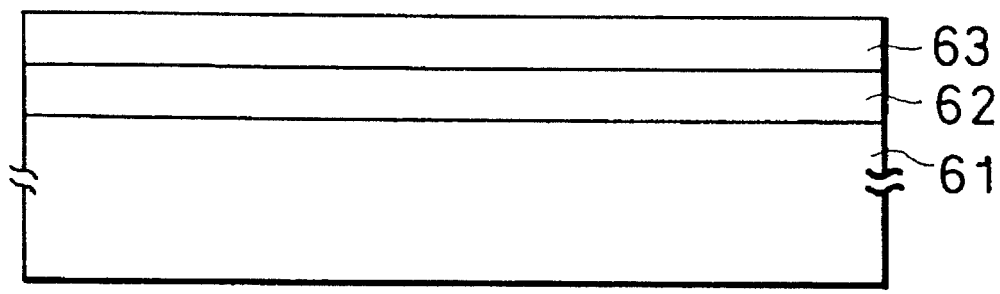
FIGS. 6(A) to 6(D) are cross sectional views of the film construction, illustrating the film fabrication process according to Example 4 of the present invention.

On the phosphorus-containing $SiO_2$ film thus obtained was further deposited a 100 nm thick a-Si film 63 which provides the channel forming region as shown in FIG. 6(A). The film was deposited from a single crystal silicon target using the RF magnetron sputtering apparatus as shown in FIG. 2. The film deposition was carried out in an atmosphere comprising Ar as the inactive gas and hydrogen, under conditions as follows:

| | |
|---|---|
| $H_2/(H_2 + Ar) = 80\%$ | (partial pressure) |
| Film deposition temperature: | 150° C. |
| RF (13.56 MHz) output power: | 400 W |
| Total pressure: | 0.5 Pa. |

A light 300 nm or shorter in wavelength may be irradiated using a UV lamp 21 (see FIG. 2) to both of the substrate 62 and the sputtered target particles during their flight in the atmosphere, to thereby obtain a denser film.

The film thus deposited was then thermally annealed for crystallization thereof in a temperature range of from 450° C. to 700° C., particularly at 600° C., for a duration of 10 hours in hydrogen or in an inactive gas. In the present Example, the annealing of the a-Si film 63 was conducted in 100% nitrogen atmosphere to obtain a silicon semiconductor layer having high crystallinity. If the film deposition of the a-Si film 63 to obtain the channel-forming region is conducted by sputtering from a non-single crystal silicon target while decreasing the power input as low as possible, a dense crystalline film composed of crystal grains having a lattice distortion and a negligibly small grain size can be obtained.

The resulting semiconductor film was analyzed by secondary-ion mass spectrometry (SIMS) for the impurity content, which yielded an oxygen content of $2\times10^{20}$ atoms.$cm^{-3}$ and a carbon content of $5\times10^{18}$ atoms.$cm^{-3}$. The hydrogen content was found to be 5% or less. These impurity content values were the minimum values in the depth profile (concentration distribution along the direction vertical to the surface of the film) of the deposited film, since the surface of the film is spontaneously oxidized by the atmosphere to form silicon oxide. These impurity content values were found to remain substantially unchanged even after crystallization.

It can be easily understood that a lower impurity content is more advantageous for utilizing the film in a semiconductor device. However, the semiconductor films according to the present invention were found to be crystalline and composed of grains having lattice distortion and hence free from barriers at the grain boundaries. Thus, a film containing an oxygen impurity even at a high concentration of about $2\times10^{20}$ atoms.$cm^{-3}$ was found to have low hindering effect on carrier mobility and to have no problem in the practical use thereof.

Figure 6B:
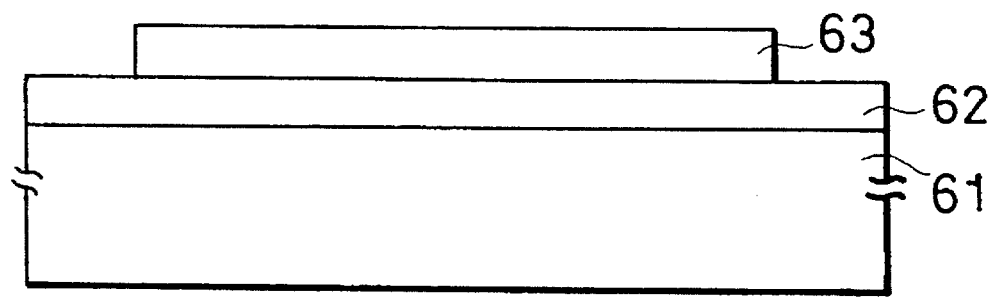
Figure 6C:
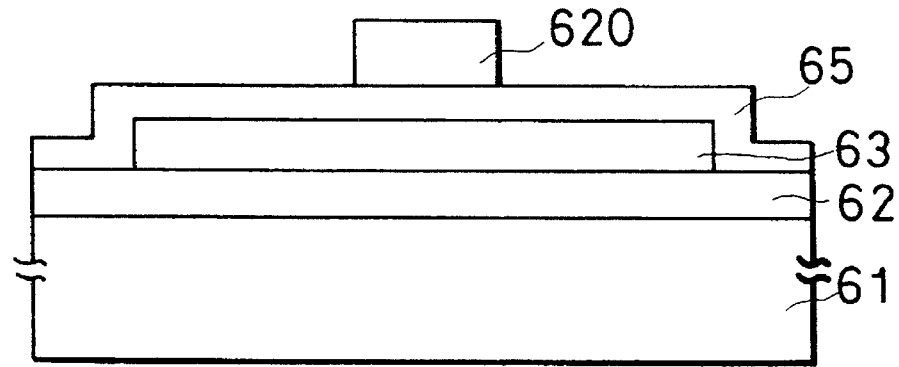
Figure 6D:
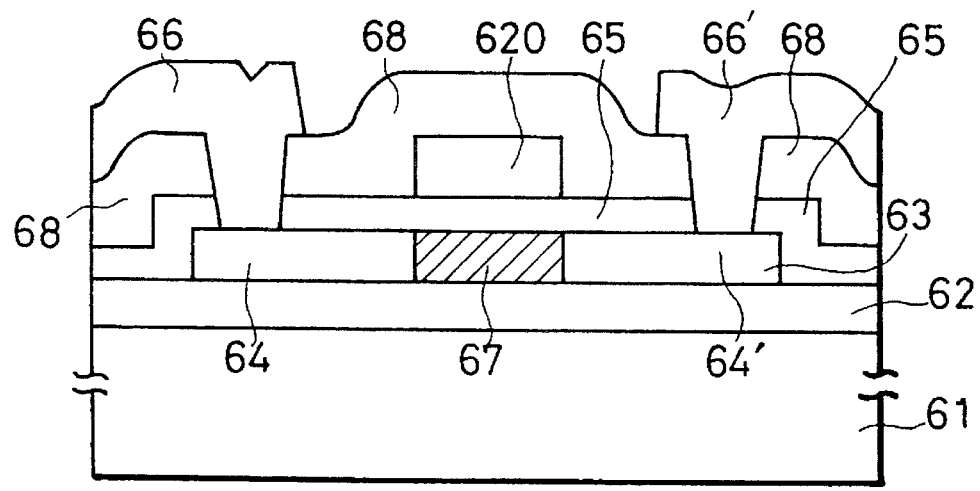
Figure 7:
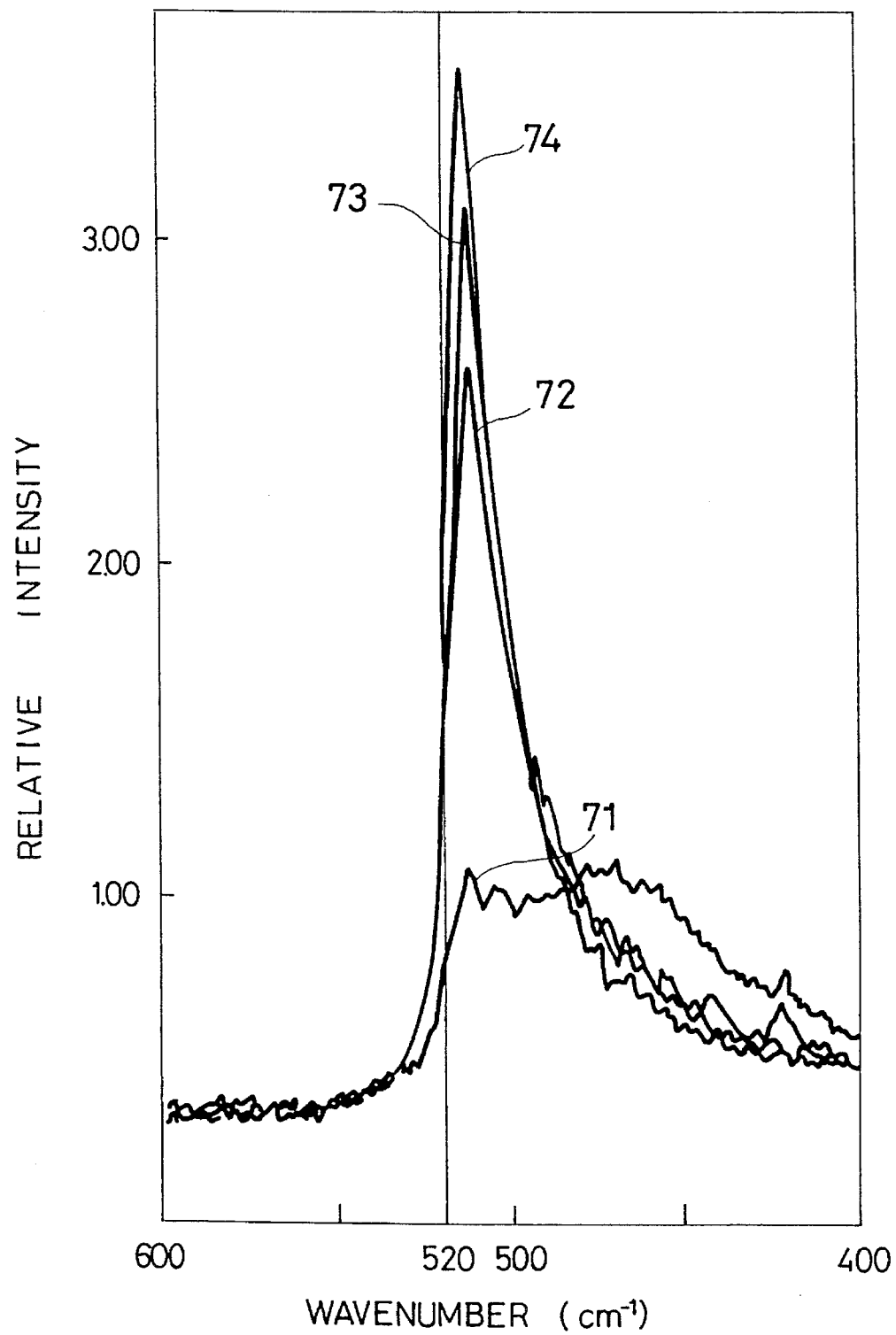
FIG. 7 shows the laser Raman spectra of the polycrystalline semiconductor layer obtained in Example 4 according to the present invention.

Furthermore, as shown in FIG. 7, the laser Raman spectra of the semiconductor films thus obtained yield peaks for the crystalline state being shifted to the lower wavenumber side as compared with the peak (520 $cm^{-1}$) obtained in the spectrum for a single crystal silicon. This result also supports the presence of lattice distortion within the crystal grains. In FIG. 7, the spectrum indicated with numeral 74 corresponds to the film 63 of FIG. 6 having deposited from an atmosphere comprising $H_2$ and Ar at the $H_2/(H_2+Ar)$ ratio of 80%, the spectra indicated with numerals 71, 72, and 73 correspond each to the films deposited from an atmosphere comprising $H_2$ and Ar at the $H_2/(H_2+Ar)$ ratio of 0%, 20%, and 50%, respectively.

An embodiment according to the present invention was described taking a silicon semiconductor as the working example, however, a germanium semiconductor as well as a semiconductor comprising a mixture of silicon and germanium were also suitable for use in the place of silicon, and in those cases, the annealing for crystallization could be carried out at a temperature about 100° C. lower than that for the silicon semiconductor.

Then, the thermally crystallized silicon semiconductor film was subjected to device-separation patterning to obtain a structure as shown in FIG. 6(B). In this way, the patterned semiconductor film 63 was provided for a channel forming region of the insulated-gate semiconductor device as shown in FIG. 6(B).

Then, a silicon oxide ($SiO_2$) film 65 was deposited further thereon at a thickness of from 50 nm to 200 m, 100 nm in the present Example, using the RF magnetron sputtering apparatus as shown in FIG. 2, from a target 203 made of synthetic quartz or silicon. The deposition of the film was carried out under conditions as follows:

| | |
|---|---|
| Reaction gas: | 92 vol. % $O_2$ |
| | 5 vol. % $NF_3$ |
| | 3 vol. % $PH_3$ |
| Film deposition temperature: | 100° C. |
| RF (13.56 MHz) output power: | 400 W |

| | |
|---|---|
| Total pressure: | 0.5 Pa. |
| Light irradiation power: | 1 kW (UV lamp) |

Referring to FIG. 2, the substrate was shielded with a shutter 207 from the sputtered particles at the initial stage of the process, while activating the surface of the substrate by concentrating a UV beam (a UV light 300 nm or shorter in wavelength) thereon using a variable mirror 26. Then, the shutter 207 was opened while continuing light irradiation to the surface of the substrate or to the surface of the substrate and the sputtered particles during their flight in the sputtering atmosphere, to thereby allow the sputtered particles to deposit on the substrate. Thus was obtained the silicon oxide film on the silicon substrate.

Again in this case, a dense silicon oxide film devoid of fixed charge could be deposited by sputtering from an amorphous silicon target under a minimized input power.

Furthermore, the incorporation of hydrogen into the silicon oxide film thus deposited can be avoided by depositing the film in 100% oxygen atmosphere by sputtering from a target having added therein phosphorus at a concentration of from $1 \times 10^{19}$ to $5 \times 10^{20}$ atoms.cm$^{-3}$. By such a method it is possible to prevent inclusion of hydrogen which turns into a trap center of hot carriers during the thermal annealing process subsequent to the film deposition process.

The deposition of a favorable film may be further enhanced by incorporating simultaneously a gas containing a halogen at an amount of from 0.2 to 20% by volume with respect to the oxide gas, since it enables neutralization of alkali ions or dangling bonds accidentally taken up into the silicon oxide during the sputtering. There is no particular restriction with respect to the sputtering method, and there may be employed an RF (radio frequency) sputtering, a DC sputtering, a high frequency magnetron sputtering, etc. However, when oxides having low electric conductivity, e.g., $SiO_2$, are used as the sputtering target, it is preferred to use a magnetron RF sputtering method from the viewpoint of conducting continuously the process under a stable discharge.

The oxide gases to be used in the process are, for example, oxygen, ozone, and nitrous oxide. As gases containing a halogen, there may be used fluoride gases, for example, nitrogen fluorides (i.e., $NF_3$ and $N_2F_4$), hydrogen fluoride (HF), fluorine ($F_2$), and Freon gases. In general, a halogen is incorporated in the film at an amount of from 0.1 to 5 atom % with respect to silicon.

The materials to be used in the sputtering preferably are each as high as possible in purity. For example, most preferred for the sputtering targets are those of synthetic quartz having a purity of 4N (99.99%) or higher, a silicon whose purity is as high as that of a silicon substrate for use in LSIs, and the like. Phosphorus may be added to such a high purity target. Similarly, the gases used in the sputtering were of high purity (5N or higher), to thereby avoid inclusion of impurities in the silicon oxide film.

Applying further an optical energy to a silicon oxide film gate insulator having deposited by sputtering in an oxygen atmosphere containing fluoride gases is effective for activating halogen elements, e.g., fluorine, which have been incorporated into the film, since the halogens thus activated neutralize the silicon dangling bonds and remove causes which develop the unwanted fixed charges within the film. Excimer lasers and the like may be used for the optical energy. In this case, the semiconductor layer under the gate insulator may be activated at the same time with the foregoing activation of the halogen atoms, by selecting properly the power and the repetition of the shots upon irradiating an excimer laser.

On the silicon oxide film 65 thus deposited was further formed by CVD, sputtering or the like, a semiconductor layer having doped therein an impurity, i.e., phosphorus in this Example, to impart one conductivity type to the layer. The phosphorus-doped semiconductor layer was subjected to photolithographic processing using a predetermined mask pattern to form a gate electrode 620 therein, and a structure as shown in FIG. 6(C) was obtained. The material for the gate electrode is not necessarily the doped semiconductor layer, but other materials can be used as well.

Self-aligned impurity regions 64 and 64' (source and drain regions) were then established by ion implantation over masks. The masks may be the gate electrode 620 or a mask used at the etching of the gate electrode 620. Thus was obtained a construction which comprises a channel forming region 67 for the insulated gate semiconductor device, having established on the upper thereof a gate electrode 620.

After covering the upper surface of the whole construction thus obtained with an interlayer insulator 68, contact holes for the source and drain electrodes were perforated, and the source and drain electrodes 66 and 66' were established by forming a metal aluminum on the interlayer insulator over the contact holes by sputtering and subsequently patterning it. Thus was finished the construction of an insulated gate semiconductor device.

The insulated gate semiconductor device thus formed is characterized by that the channel forming region 67, the source 64, and the drain 64' are all made from the same semiconductor layer. An advantage is that the fabrication process can be simplified. Another advantage is that the source and the drain have high carrier mobility and hence are improved in electrical properties.

Finally, the construction above was finished by thermally annealing the structure obtained in the foregoing in 100% hydrogen atmosphere at 375° C. for 30 minutes, to thereby obtain an insulated gate TFT according to the present invention which is shown in FIG. 6(D), comprising a channel portion 67 having an area of 100 μm×100 μm. The thermal annealing in hydrogen improves device characteristics by reducing the grain boundary potential within the polycrystalline silicon semiconductor.

The TFT fabricated in the present Example yields characteristics as shown in the Table 1 below. The TFT a is the one fabricated in the present Example, and b is a TFT fabricated without irradiating a light at the deposition of the gate oxide film in Table 1.

TABLE 1

| TFT | S value | VT | μ(cm$^2$/Vs) | ON/OFF ratio |
|---|---|---|---|---|
| a | 0.55 | 4.5 | 25.2 | 6.2 |
| b | 0.60 | 9.1 | 14.4 | 5.9 |

In the Table, S value is the minimum [d(ID)/d(VG)] of the rising portion as read from the [gate voltage (VG)–drain current (ID)] (VG–ID) curve at the drain voltage (VD) of 10 V. The smaller this S value, the larger is the gradient of the curve, and hence the better is the device characteristics.

VT represents the threshold voltage.

μ represents the carrier mobility.

ON/OFF ratio is the logarithm of the ratio of the ID at VG=30 V and the minimum ID as read from the VG–ID curve at a fixed drain voltage of 10 V.

Table 1 reads that the insulated-gate FET fabricated using, as the gate insulator, the silicon oxide film thus deposited by sputtering in an oxygen atmosphere while irradiating a light 300 nm or shorter in wavelength has superior characteristics as compared with a FET fabricated using a silicon oxide film deposited without irradiating a light beam. This is ascribed to the improved electric characteristics of the gate insulator, particularly to the achievement of the reduced density of interface states (interface level), which had been a lasting problem in the conventional thin-film devices. The fact that the characteristics of an insulated gate field-effect TFT partly depend on the density of interface states between the gate insulator (oxide film) and the semiconductor layer also supports the foregoing explanation.

As a further preferred mode of carrying out the process according to the present invention, there should be mentioned that the semiconductor layers are deposited by sputtering in an atmosphere containing hydrogen at a partial pressure thereof of 80% or higher.

The sputtering apparatus used in the present invention and illustrated in FIG. 2 utilizes a high frequency at 13.56 MHz. However, there is no particular restriction to the apparatus to be used in the process, and the frequency as well as the power thereof can be selected as desired.

Also preferred is to use a light at an intensity as high as possible for the irradiation, provided that it is a light having a spectrum 300 nm or shorter in wavelength.

While the invention has been described in detail and with reference to specific embodiments thereof, it will be apparent to one skilled in the art that various changes and modifications can be made therein without departing from the spirit and scope thereof.

What is claimed is:

1. A method of forming an oxide insulating film comprising:
   sputtering a material in an atmosphere comprising an oxidizing gas at a first volume ratio in a chamber;
   emitting a light into said chamber to enhance the sputtering; and
   depositing the sputtered material on a substrate
   wherein said atmosphere further comprises an inactive gas at a second volume ratio wherein said second volume ratio is less than said first volume ratio.

2. The method of claim 1 wherein at least one of said substrate and the sputtered material on the way to said substrate is irradiated with a light during the deposition.

3. The method of claim 1 wherein said light comprises a light having wavelength of no more than 300 nm.

4. The method of claim 1 wherein said light comprises an ultraviolet ray.

5. The method of claim 1 wherein said oxidizing gas comprises a gas selected from the group consisting of oxygen, ozone and nitrous oxide.

6. The method of claim 1 wherein said atmosphere further comprises a gas selected from the group consisting of $PH_3$, $B_2H_6$ and a halogen containing gas.

7. The method of claim 1 wherein said sputtering is implemented by radio frequency sputtering, D.C. sputtering or a high frequency magnetron sputtering.

8. A method of forming an insulated gate field effect transistor comprising:
   forming a semiconductor film to be a channel on a substrate;
   forming an oxide insulating film on said semiconductor film by sputtering a material in an atmosphere comprising an oxidizing gas at a first volume ratio with at least one of the sputtered material on the way to a surface to be coated therewith and said surface irradiated with a light;
   forming source and drain semiconductor regions on said substrate; and
   forming a gate electrode on said oxide insulating film in order to define a channel under said gate electrode between said source and drain regions
   wherein said atmosphere further comprises an inactive gas at a second volume ratio wherein said second volume ratio is less than said first volume ratio.

9. The method of claim 8 further comprising the step of forming on said substrate an oxide insulating film prior to the formation of said semiconductor film by sputtering a material in an atmosphere comprising an oxidizing gas with at least one of the sputtered material on the way to said substrate and said substrate irradiated with a light.

10. The method of claim 9 wherein both of said sputtered material and said substrate are irradiated with a light during the formation of the oxide insulating film prior to the formation of said semiconductor film.

11. The method of claim 8 wherein both of said sputtered material and said surface are irradiated with a light during the formation of said oxide insulating film.

12. The method of claim 8 wherein said light comprises a light having wavelength of no more than 300 nm.

13. The method of claim 8 wherein said light comprises an ultraviolet ray.

14. A method of forming a capacitor comprising:
   forming an electrode layer on a substrate;
   forming an oxide insulating layer on said electrode layer by sputtering a material in an atmosphere comprising an oxidizing gas at a first volume ratio with at least one of the sputtered material on the way to a surface to be coated therewith and said surface irradiated with a light; and
   forming another electrode layer on said oxide insulating layer
   wherein said atmosphere further comprises an inactive gas at a second volume ratio wherein said second volume ratio is less than said first volume ratio.

15. The method of claim 14 wherein both of said sputtered material and said surface are irradiated with a light during the sputtering.

16. The method of claim 14 wherein said light comprises a light having wavelength of no more than 300 nm.

17. The method of claim 14 wherein said light comprises an ultraviolet ray.

* * * * *